(12) United States Patent
Goel et al.

(10) Patent No.: US 7,350,134 B2
(45) Date of Patent: Mar. 25, 2008

(54) METHOD AND APPARATUS OF RELOADING ERRONEOUS CONFIGURATION DATA FRAMES DURING CONFIGURATION OF PROGRAMMABLE LOGIC DEVICES

(75) Inventors: Ashish Kumar Goel, Uttar Pradesh (IN); Namerita Khanna, New Delhi (IN); Davinder Aggarwal, New Delhi (IN)

(73) Assignee: Sicronic Remote KG, LLC, Wilmington, DE (US)

( * ) Notice: Subject to any disclaimer, the term of this patent is extended or adjusted under 35 U.S.C. 154(b) by 710 days.

(21) Appl. No.: 10/667,199

(22) Filed: Sep. 18, 2003

(65) Prior Publication Data

US 2004/0153923 A1 Aug. 5, 2004

(30) Foreign Application Priority Data

Sep. 20, 2002 (IN) ........................ 958/02

(51) Int. Cl.
 *G11C 29/00* (2006.01)
 *G06F 11/00* (2006.01)
(52) U.S. Cl. ...................... 714/764; 714/799
(58) Field of Classification Search ................ 714/704, 714/764

See application file for complete search history.

(56) References Cited

U.S. PATENT DOCUMENTS 5,870,586 A * 2/1999 Baxter .......................... 716/16
6,560,743 B2 * 5/2003 Plants .......................... 714/763
7,111,224 B1 * 9/2006 Trimberger ................... 714/764

OTHER PUBLICATIONS

ALTERA's Application Note 116 "Configuring APEX 20K, FLEX 10K, 6000 Devices," pp. 1-77, May 2000.
ALTERA's Application Note 33 "Configuring FLEX 8000 devices," pp. 33-71, Jun. 2000.
Xilinx's Application Note XAPP138 "Virtex FPGA Series Configuration and Readback," pp. 1-39, Jul. 11, 2002.
Xilinx Inc., *The programmable Logic databook 1999*, May 14, 1999, version 1.6, "XC4000E and XC4000X Series Field Programmable Gate Arrays," pp. 6-49-6-72.

* cited by examiner

*Primary Examiner*—Shelly Chase

(57) ABSTRACT

An improved method and apparatus for reloading frames in which errors are detected during the Programmable Logic Device configuration. A configuration data frame for a FPGA is loaded to the Frame register of the FPGA and also to an error detection circuit which detects errors with the loaded frame. An error counter value is maintained by the apparatus and is incremented each time an error with a frame is detected. The incremented value is compared by a Comparator circuit with a pre-determined threshold value 'n'. If a match is found then the configuration process is aborted, else the data frame is reloaded in the configuration memory, transferred again to the frame register and rechecked for errors. If no error is detected with the reloaded frame, the error counter value is reset and the next frame is loaded until the FPGA configuration process is over.

35 Claims, 5 Drawing Sheets

METHOD AND APPARATUS OF RELOADING ERRONEOUS CONFIGURATION DATA FRAMES DURING CONFIGURATION OF PROGRAMMABLE LOGIC DEVICES

BACKGROUND OF THE INVENTION

1. Field of the Invention

The present invention relates to programmable devices such as Programmable Logic devices (PLDs). More particularly, it relates to configuration of Programmable Logic devices (PLDs) and provides a method and apparatus to reload erroneous data frames during PLD configuration.

2. Description of the Related Art

PLDs are widely used for implementing digital logic. A PLD is configured for the desired circuit prior to use. For this purpose the PLD incorporates a configuration memory that defines its functional behavior based on data stored in it. Field Programmable Gate Arrays (FPGAs) are the most widely used PLD devices. A typical FPGA includes a matrix of logic blocks, routing resources and I/O blocks. In addition to this it also includes configuration memory cells and configuration control logic. Values stored in the memory cell control the operation of FPGA, i.e., functionality of FPGA is defined by the values stored in FPGA memory cells. Bits are loaded in the configuration memory cells through a configuration logic that is provided by configuration devices.

FIG. 1 defines a conventional FPGA configuration process flow as described in ALTERA's application note 116 "Configuring APEX20K, FLEX10K, FLEX6K devices, ALTERA's application note 33 "Configuring FLEX8K devices", Virtex's application note XAPP138 "FPGA Series Configuration and Readback" and Xiinx. Inc.'s "The programmable Logic databook 1999". The FPGA is first brought into the configuration mode 100, following which the configuration memory is cleared 102. The configuration memory is cleared by storing 0's or 1's in all the cells of the memory. In case of partial configuration, configuration memory is not cleared and step 102 is bypassed. In step 104, configuration data is loaded frame by frame. After each frame is loaded, an error detection circuit checks the frame for any error in step 106. There are several methods for checking the frame for errors such as parity check, Cyclic Redundancy Check (CRC) etc., but the most popular method is a CRC check. If no error is detected in the frame, then the process moves onto step 108 to check whether the end of configuration process has been reached or not. If the configuration process is not over, i.e., more frames are still to be loaded, the process flow reverts to step 104 and the next frame is loaded. Subsequently steps 106 and 108 are followed again until the end of configuration of the FPGA. When the end of configuration is reached, the FPGA device comes back to the start up mode as shown in step 110. After the device is configured it can start its normal operation.

If any error is detected in the data frame at step 106, the STATUS signal is set into the 'High' state in step 107, indicating an error in the data frame. The configuration is stopped and the process restarts all over again from step 100 and all the frames are reloaded again. This method of configuration of a FPGA device is inefficient because even if an error occurs in the last frame to be loaded to the device, all the frames successfully loaded prior to that frame have to be loaded again, leading to wastage of time.

BRIEF SUMMARY OF THE INVENTION

An embodiment of the present invention is directed to an improved method and apparatus for configuration of a FPGA device wherein an erroneous frame is reloaded without requiring reloading of all frames.

The invention is directed to an improved method and apparatus to reload an erroneous frame during PLD configuration.

An embodiment of the invention provides an improved method and apparatus for reloading frames in which errors are detected during configuration. A configuration data frame for a FPGA is loaded to the frame register of the FPGA and also to an error detection circuit which detects errors with the loaded frame. An error count is maintained by the apparatus and is incremented each time an error is detected. The incremented value is compared with a predetermined threshold value 'n' by a comparator circuit. If a match is found then the configuration process is aborted, otherwise the data frame is reloaded in the configuration memory, transferred again to the frame register and rechecked for errors. If no error is detected with the reloaded frame, the error count is reset and the next frame is loaded until the FPGA configuration process is over.

In one embodiment, a programmable logic device (PLD) having a configuration frame register for loading configuration data frames, a plurality of memory cells for storing data from the configuration data frames, an error detection circuit, an address counter, a controller, an error counter, a comparator and an abort configuration circuit is configured to load configuration data frames one at a time and verify the frame does not contain errors before proceeding to load the next frame. If an error is detected during the loading of a frame, that frame is reloaded. If a frame is successfully loaded, data from the frame is stored in the memory cells and the next frame is processed. If too many errors occur, the process is aborted.

BRIEF DESCRIPTION OF THE DRAWINGS

The objects and advantages of the invention will become more apparent in reference to the following description of embodiments and of the accompanying drawings, wherein.

DETAILED DESCRIPTION OF THE INVENTION

A typical FPGA device can be configured in various modes out of which the most common is a Slave and Master mode. In Master mode, the FPGA controls its configuration operation. The clock signal and memory addresses are provided by the FPGA itself to the configuration device, typically a programmable read only memory (PROM). On the other hand when the FPGA works in slave mode, an external controller, typically a Master FPGA, controls its configuration process. The external controller or master FPGA controls the configuration operation by providing the clock and memory addresses.

Figure 1:
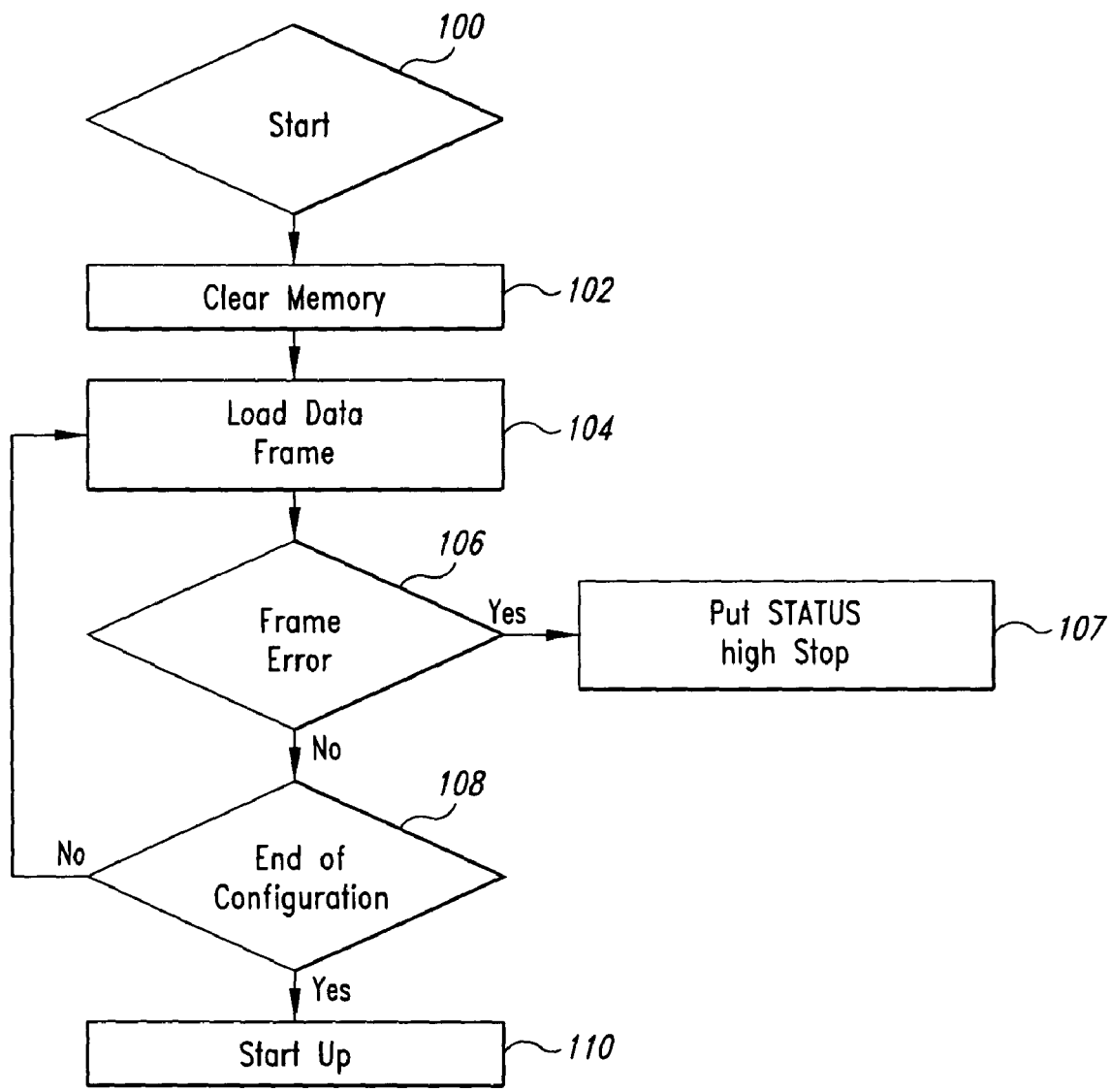
FIG. 1 is a flow chart illustrating a conventional configuration process of a FPGA device.

FIG. 1, which shows the prior art configuration process, has already been described above.

Figure 2:
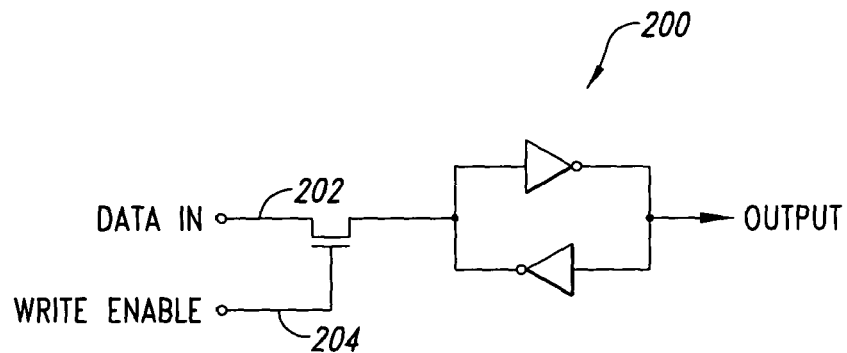
FIG. 2 shows a configuration memory cell of a conventional FPGA.

FIG. 2 shows a configuration memory cell 200 used in a conventional FPGA device. The memory cell has a write enable (WE) signal line 204 that receives signals to control the storage of data in the memory cell 200. To enable storing of data in the memory cell 200, the state of the WE signal 204 is set to 'high', following which the data available at input DATAIN 202 is latched in the memory cell 200. Once the data has been stored, the WE signal 204 reverts back to a 'low' state. The WE signal 204 may also be controlled by a logic wherein it allows data to be latched when in the 'low' state while remaining in the 'high' state otherwise.

Figure 3:
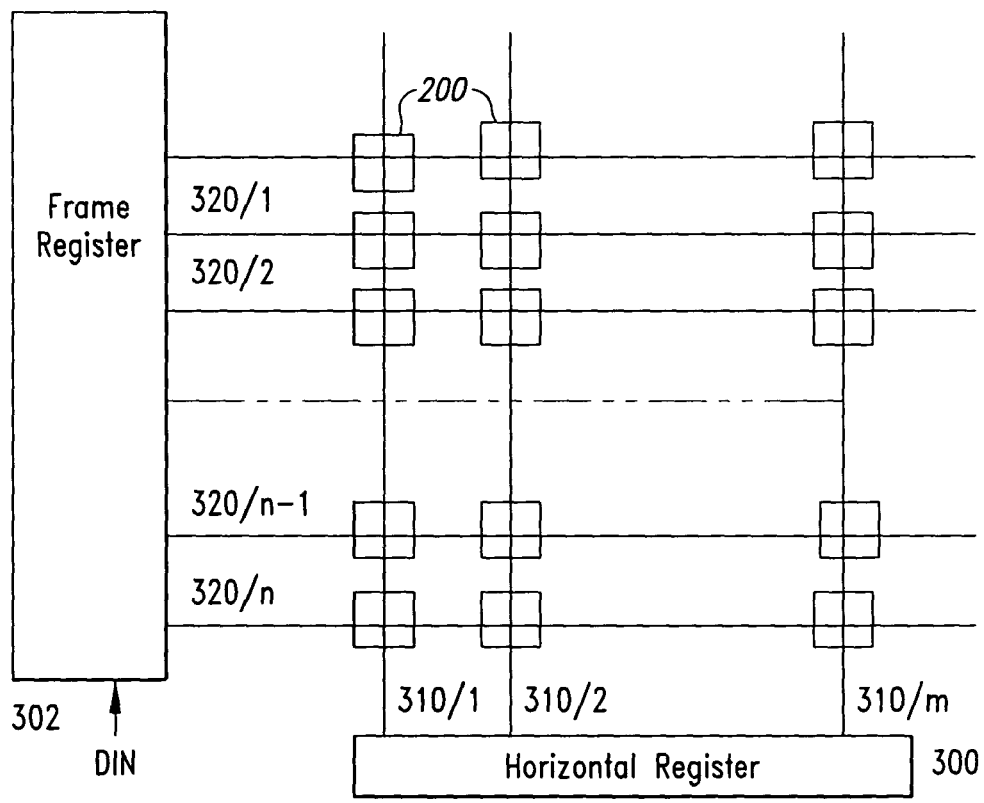
FIG. 3 shows an arrangement of configuration memory cells in a conventional FPGA.

FIG. 3 shows arrangement of configuration memory cells 200 (as described in FIG. 2) in a conventional FPGA. These memory cells 200 are arranged in the array of rows and columns. All memory cells 200 in a particular row share the same data line while all memory cells 200 in a particular column share a common write enable signal line. Write enable signals are generated by a horizontal register 300 and data signals are the output of the FRAME register 302.

Frame register 302 is a shift register. Data input to the frame register 302 is through input DIN. At the start of the configuration process, data is loaded in the frame register. At this time all write-enable signals 310/1, 310/2 . . . 310/m to the memory cell columns are disabled. After one complete frame is loaded in the frame register 302, one of the write enable signals, for example signal 310/1 is enabled and configuration data is loaded in the first column through the data lines 320/1, 320/2 . . . 320/n. Following this, a new data frame is loaded in the frame register 302 and the write-enable signal 310/2 for the next column of memory cells 200 is enabled and data is loaded in the corresponding memory cells 200 from the frame register 302 through the data lines 320/1, 320/2 . . . 320/n. This process continues until all the memory cells 200 have been loaded with the configuration data.

Figure 4:
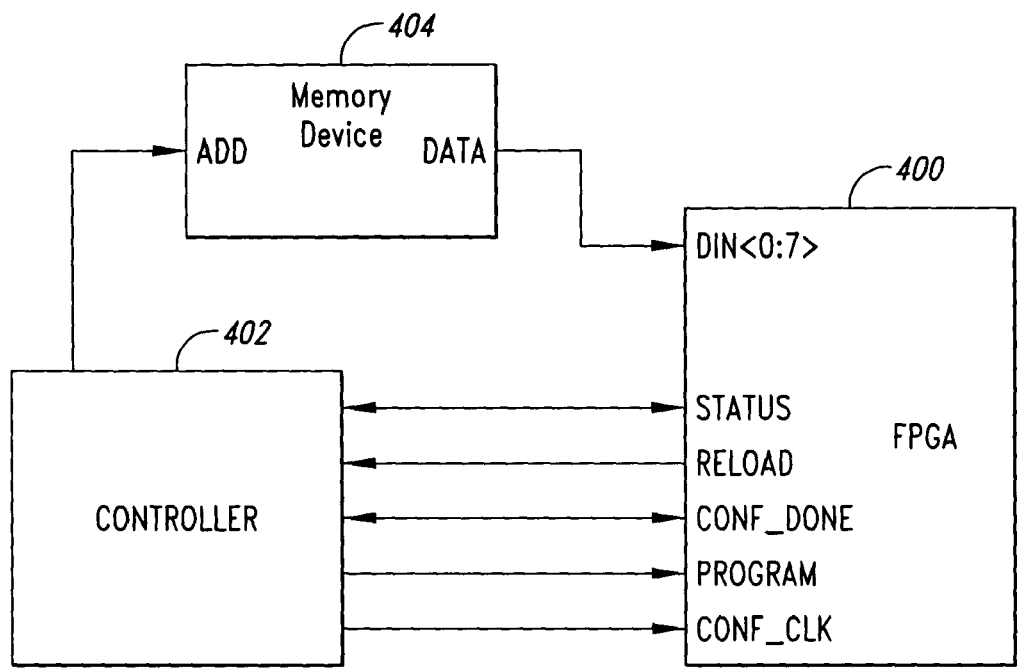
FIG. 4 shows an interface of FPGA with an external controller and memory device when working in SLAVE mode.

FIG. 4 shows an interface of FPGA 400 with an external controller 402 and memory device 404 when working in SLAVE mode, that can be employed in an embodiment of the invention. In slave mode, the controller 402 provides addresses to the memory device 404 and a clock signal to FPGA 400. A pulse on PROGRAM pin of the FPGA 400 initiates the configuration process. CONF_DONE indicates the completion of the configuration process. During the configuration, it remains in a 'low' state and after completion of configuration it goes to a 'high' state, indicating the end of configuration. The state transition may be vice-versa also depending on the logic followed by the circuit. A STATUS pin is used to indicate permanent error in configuration. If the STATUS pin has a 'high' pulse the configuration process is aborted. As in case of CONF_DONE pin, the STATUS pin can be set to abort the configuration when it receives a 'low' signal.

A pulse on RELOAD indicates that some error has been detected in the frame and causes the controller 402 to decrement the address by one frame so that the erroneous frame can be reloaded. A clock signal is provided to the FPGA 400 by the controller through CONF_CLK input pin. Data to FPGA 400 comes from memory device 404 via data pins DIN.

There can be n number of data pins depending on the FPGA. FIG. 4, used only for illustrative purposes, depicts a FPGA that can accept data in one byte at a time therefore, it has 8 data input pins DIN<0:7>. But a FPGA 400 that accepts data in serial mode, may have only one pin and memory device 404 may be of X1 type.

Memory device 404 can also be within the controller. In both the embodiments, addresses are provided to the memory device 404 by controller 402.

Figure 5:
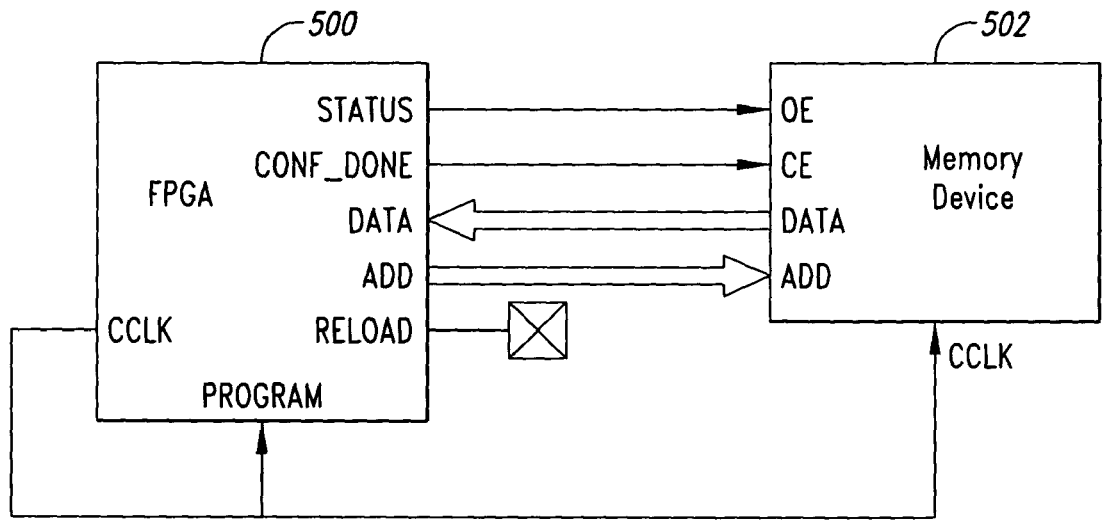
FIG. 5 shows an interface of FPGA with a memory device when working in MASTER mode.

FIG. 5 shows an interface of a FPGA 500 with a memory device 502 when working in MASTER mode, that can be employed in an embodiment of the invention. In master mode, FPGA 500 controls its own configuration operation. The addresses and clock signal (in case of synchronous memory) to the memory 502 are provided by the FPGA 500 itself. The CONF_DONE pin of the FPGA 500 indicates whether the configuration is in progress or not. The CONF_DONE pin is connected with the chip enable signal (CE) of the memory device 502. When the configuration process is initiated, the CONF_DONE signal enables the memory device 502 and disables it at the end of the process. The STATUS pin indicates that a permanent error has been detected during configuration. This pin is connected to output enable (OE) of the memory device 502. Since addresses are provided to memory device 502 by the FPGA 500, the RELOAD signal is not connected outside the FPGA 500. Data and addresses are exchanged between the FPGA 500 and the memory 502 through the DATA and ADD lines.

Figure 6:
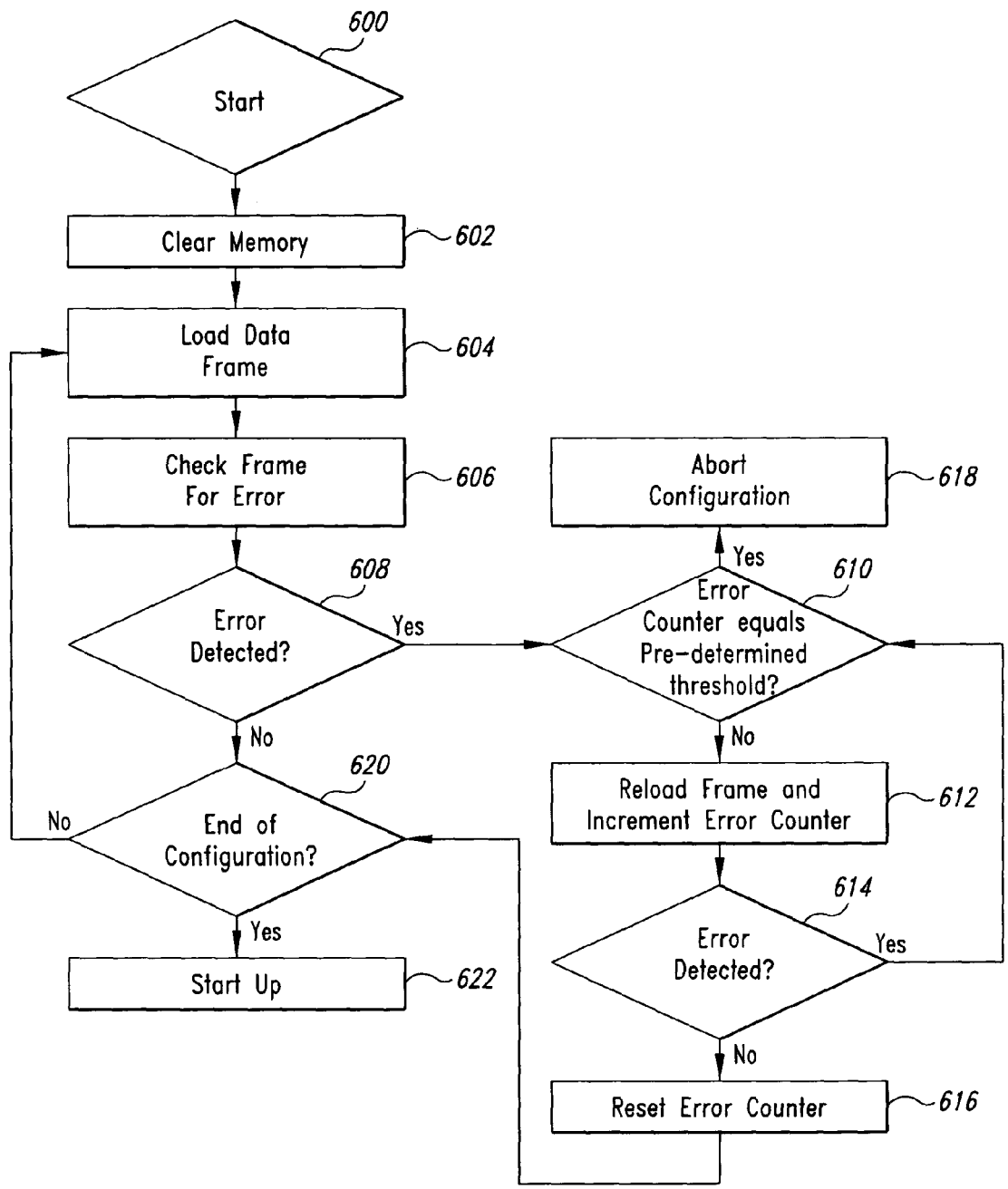
FIG. 6 is a flow chart illustrating an exemplary method of programming a FPGA device in accordance with the invention.

FIG. 6 is a flow chart illustrating an exemplary method of configuring a FPGA in accordance with the invention. The process starts with the FPGA coming into configuration mode 600, following which the configuration memory is cleared 602. If only a partial configuration is to be done, then the memory is not cleared. A frame is loaded in the memory and the loaded frame is transferred to the frame register of the FPGA in step 604. This configuration data simultaneously goes to an error detection circuit. Once the complete frame is loaded in the frame register but before it is loaded to the memory cells of the FPGA, it is checked for errors by an error detection circuit in step 606. If no error is detected at step 608, then the configuration process goes onto step 620 where it is checked whether configuration is over or not. If configuration is not over, then the process flow returns back to step 604 where the next frame is loaded and transferred to the frame register. This process goes on until configuration of the FPGA is completed.

In case an error is detected at step 608, the process flow is transferred to step 610, where a comparator in the error checking circuit compares an error counter value with a pre-determined threshold value 'n'. If the error counter value is less than the threshold, then at step 612 the previous frame is reloaded again in the memory, reloaded frame is transferred to the frame register and the error counter is incremented by one. After the complete frame is reloaded in the frame register, it is again checked for errors in step 614. If the error persists, then a RELOAD signal is generated and process flow returns to step 610. This process continues until the error counter value exceeds the pre-determined threshold or the error does not persist when checked at step 614. If error counter value exceeds the pre-determined threshold then the configuration process is aborted indicating permanent error in step 618. Otherwise, in case no error is detected in the reloaded frame at step 614, the error counter is reset in step 616 and the process flow is redirected to step 620 where end of configuration is checked. If configuration is over, then start-up sequence starts 622 and the FPGA begins with its normal operation, otherwise the next frame is loaded in step 604. In an exemplary embodiment, another error counter is incremented when an error occurs, but is not reset when a frame is successfully loaded. If this error counter exceeds another pre-determined threshold, the configuration process is aborted.

Figure 7:
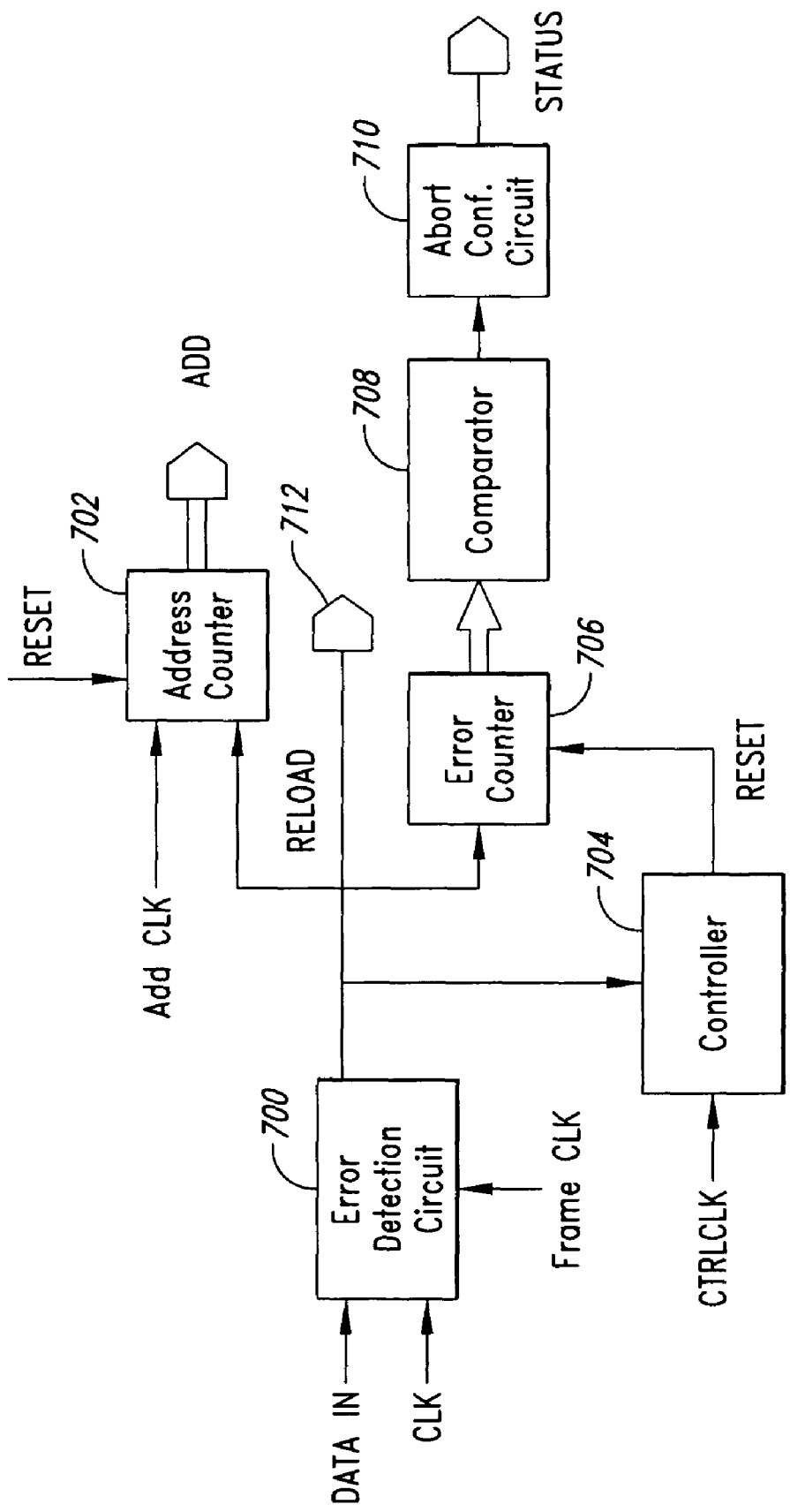
FIG. 7 shows an improved control logic within the FPGA that can be used in accordance with the present invention.

FIG. 7 shows the block diagram of a controller circuit of an embodiment of the invention. It contains an error detection circuit 700, which is used to detect errors in the frame. The error detection circuit can implement various error detection algorithms such as parity check, CRC check etc. An Error counter 706 is provided to maintain a counter indicating the number of times an error has been detected in the loaded frame. A Comparator circuit 708 is used to compare the error counter value to the pre-determined threshold value 'n'. Abort configuration circuit 710 aborts the configuration if the error counter value matches with the pre-determined threshold value 'n'. An Address counter 702 provides addresses to the memory when the FPGA works in Master mode operation. In Slave mode the addresses are provided by an external controller or master FPGA. Controller circuit 704 is used to RESET the error counter value. The functioning of circuit is as follows:

Data from the memory device (see FIGS. 4 and 5) is loaded in the frame register (See FIG. 3) of the FPGA and simultaneously transferred to the Error detection circuit 700. Once the complete frame is loaded in frame register, a configuration state machine (not shown) generates a FRAMECLK signal used to check the frame for errors. CTRLCLK, another signal generated by the state machine, goes to the Controller circuit 704 and is used by it to sample the RELOAD signal. The ADDCLK signal also generated by the configuration state machine (in case of master mode) goes to the Address counter 702 and is used to increment the address in the memory so that the next frame can be loaded.

If an error is detected in a frame during the configuration process, a RELOAD signal is activated. This signal goes to Address counter 702, Error counter 706 and Controller circuit 704. The Error counter 706 increments the error counter value on detection of RELOAD signal, while the Address counter 702 decrements its value by one frame in case the FPGA is working in the Master mode. If the FPGA is working in the slave mode, the RELOAD pad 712 causes an external Controller device or Master FPGA to decrement its address counter by one frame. Both of these steps cause the frame to be reloaded in the configuration memory and the reloaded frame to be transferred to the frame register again. Once the frame is reloaded in the frame register and no error is detected in the frame, the Controller 704 generates the RESET signal to reset the error counter value. If the error is encountered again in the reloaded frame, the error counter value is incremented each time and compared by the Comparator 708 to check whether the error counter value has become equal to a pre-determined threshold value 'n'. When the values become equal, the Abort Config circuit 710 activates the STATUS signal causing the configuration to abort.

Hence, using this apparatus an erroneous frame can be reloaded again in case of error during the configuration process without the need to abort the configuration process on each error and reload all the frames all over again and thus saving a lot of configuration time and effort. In an exemplary embodiment, the configuration process is not allowed to enter into an infinite loop in case errors persist through the use of the pre-determined threshold.

The description of the present invention has been presented for purposes of illustration and is not intended to be exhaustive or limited to the invention in the form disclosed. Many modifications and variations will be apparent to those of ordinary skill in the art.

The invention has been described as practiced for a FPGA device configuration as the preferred embodiment. However, the invention can be practiced in relation to any Programmable Logic Device (PLD).

The steps and modules described herein and depicted in the drawings may be performed or constructed in either hardware or software or a combination of both, the implementation of which will be apparent to those skilled in the art from the preceding description of the invention and the drawings. Certain modifications may be made to the hereinbefore described embodiments of the invention without departing from the spirit and scope of the invention, and these will be apparent to persons skilled in the art.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

That which is claimed is:

1. An improved method for detecting errors in configuration data frames loaded into a frame register of a Programmable Logic Device (PLD) and reloading only erroneous configuration data frames comprising the steps of:
   clearing the frame register of a configuration memory of the PLD;
   loading a new configuration data frame into the frame register and into an error detection circuit;
   checking said data frame for errors and transferring data in the frame register to memory cells of the PLD if no error is detected;
   reloading the frame register of the PLD and incrementing an error counter value if errors are encountered; and
   repeating above steps until all desired configuration data frames are loaded.

2. The method as claimed in claim 1, further comprising the step of aborting the loading and reloading if the error counter value equals a threshold value.

3. The method as claimed in claim 1 wherein the error checking is performed using an error detection algorithm including cyclic redundancy checking and parity checking.

4. The method as claimed in claim 1 wherein the error counter value is reset before loading a new configuration data frame in the frame register.

5. The method as claimed in claim 1 wherein reloading of the frame is achieved by adjusting an address counter when the PLD operates as a Master.

6. The method as claimed in claim 1 wherein reloading of the frame is achieved by signaling an external controller to adjust an address counter when the PLD operates as a Slave.

7. The method of claim 1 further comprising operating the PLD as a master.

8. The method of claim 1 further comprising operating the PLD as a slave.

9. An improved Programmable Logic Device (PLD) incorporating a circuit arrangement for detecting errors in configuration data frames loaded into its frame register and reloading erroneous configuration data frames, comprising:

error detecting means for checking the configuration data loaded in the frame register, error counting means for incrementing an error count for each error detected in said configuration data frame, comparing means for comparing the error count to a threshold value, and reloading means for reloading a configuration data frame into the frame register if errors are encountered.

10. The improved PLD as claimed in claim 9, further comprising means for aborting a PLD configuration process in case the error counter value equals the threshold value.

11. The improved PLD as claimed in claim 9 wherein the error detecting means implements an error detection algorithm including cyclic redundancy checking and parity checking.

12. The improved PLD as claimed in claim 9 wherein a controller is provided to reset the error count before loading a new configuration data frame in the frame register.

13. The improved PLD as claimed in claim 9 wherein the reloading means comprises an address counter to enable reloading of the erroneous frame into the frame register in case of errors when the PLD operates as a Master.

14. The improved PLD as claimed in claim 9 wherein the reloading means comprises an external controller to enable reloading of the erroneous frame into the frame register in case of errors when the PLD operates as a Slave.

15. The improved PLD as claimed in claim 9 wherein the PLD is configured as a master.

16. The improved PLD as claimed in claim 9 wherein the PLD is configured as a slave.

17. A method of configuring a programmable logic device (PLD), comprising:

loading a first one of a plurality of configuration data frames into a frame register;

checking the loaded data frame for errors;

if an error is detected, repeating the above steps for the configuration data frame in which an error was detected;

if an error is not detected, transferring data from the frame register to at least one memory cell; and subsequently repeating the above steps for a second configuration data frame in the plurality of configuration data frames.

18. The method of claim 17 wherein the step of checking the loaded data frame for errors comprises running a cyclic redundancy check.

19. The method of claim 17, further comprising incrementing an error count when an error is detected.

20. The method of claim 19, further comprising aborting the configuration if the error count exceeds a threshold number.

21. The method of claim 19, further comprising resetting the error count when data is transferred from the frame register to the at least one memory cell.

22. The method of claim 17 wherein the PLD comprises a field programmable gate array.

23. The method of claim 17, further comprising configuring the PLD as a master.

24. The method of claim 17, further comprising configuring the PLD as a slave.

25. The method of claim 17, further comprising identifying the one of a plurality of configuration data frames using an address counter.

26. The method of claim 17, further comprising clearing the frame register.

27. The method of claim 17 wherein the at least one memory cell comprises a latch.

28. A system for configuring a programmable logic device (PLD), comprising:

means for sequentially loading a plurality of configuration data frames;

means for detecting errors in a loaded configuration data frame; means for correcting detected errors in a loaded configuration data frame without reloading other configuration data frames and before loading subsequent configuration data frames; and means for storing data contained in the plurality of configuration data frames.

29. The system of claim 28, further comprising means for aborting configuration.

30. The system of claim 28 wherein the means for loading a configuration data frame, the means for detecting errors, the means for correcting errors and the means for storing data are part of a PLD.

31. A programmable logic device (PLD), comprising:

a configuration frame register to load a plurality of configuration data frames;

a plurality of memory cells to store configuration data; and an error detection circuit to detect errors in a loaded configuration data frame, wherein the PLD is configured to reload a single configuration data frame into the configuration frame register upon detecting an error and to transfer data from the configuration frame register to at least one of the plurality of memory cells in the absence of an error.

32. The programmable logic device of claim 31 wherein the error detection circuit comprises an error counter and the PLD is configured to abort loading of a configuration data frame if an error count equals a threshold value.

33. The programmable logic device of claim 32 wherein the error counter is reset before loading a new configuration data frame in the frame register.

34. The programmable logic device of claim 31 wherein the PLD is configured to reload the frame by adjusting an address counter when the PLD operates as a Master.

35. The programmable logic device of claim 31 wherein the PLD is configured to reload the frame by signaling an external controller to adjust an address counter when the PLD operates as a Slave.

* * * * *